United States Patent
Scanlan et al.

(10) Patent No.: US 6,809,673 B2
(45) Date of Patent: Oct. 26, 2004

(54) MULTI-CHANNEL CIRCUIT WITH CURRENT STEERING DIGITAL TO ANALOGUE CONVERTERS WITH MINIMIZED CROSSTALK

(75) Inventors: Anthony Scanlan, Limerick (IE); John Patrick Purcell, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/268,273

(22) Filed: Oct. 10, 2002

(65) Prior Publication Data

US 2003/0112164 A1 Jun. 19, 2003

Related U.S. Application Data

(60) Provisional application No. 60/328,196, filed on Oct. 10, 2001.

(51) Int. Cl.[7] ................................................ H03M 1/66
(52) U.S. Cl. ........................ 341/144; 341/135; 341/136
(58) Field of Search ................................. 341/144, 135, 341/136, 145, 118, 120; 327/108

(56) References Cited

U.S. PATENT DOCUMENTS

| | | | |
|---|---|---|---|
| 5,343,196 A | | 8/1994 | Harston ...................... 341/136 |
| 5,638,011 A | * | 6/1997 | Nguyen ...................... 327/108 |
| 5,815,103 A | * | 9/1998 | Comminges et al. ....... 341/144 |
| 6,052,074 A | | 4/2000 | Iida ............................ 341/135 |
| 6,295,012 B1 | * | 9/2001 | Greig .......................... 341/136 |
| 6,545,622 B1 | * | 4/2003 | Kamal et al. ............... 341/144 |
| 6,583,744 B2 | * | 6/2003 | Bright ........................ 341/145 |
| 6,741,195 B1 | * | 5/2004 | Cho ............................ 341/136 |

* cited by examiner

*Primary Examiner*—Patrick Wamsley
(74) *Attorney, Agent, or Firm*—Iandiorio & Teska

(57) ABSTRACT

A multi-channel circuit (1) comprising three channels (CH1 to CH3), each of which is provided with a current steering DAC (5) in which crosstalk between the respective DACs (5) is minimized. Each DAC (5) comprises binary scaled current source devices ($Q_{s1}$ to $Q_{sn}$) and current steering switches ($Q_{t1}$ and $Q_{f1}$ to $Q_{tn}$ to $Q_{fn}$) for steering currents from the current source devices ($Q_{s1}$ to $Q_{sn}$) to summing nodes (11,12) across which an analogue signal is developed corresponding to a digital input word. Cascode devices ($Q_{c1}$ to $Q_{cn}$) are provided between the respective current source devices $Q_{s1}$ to $Q_{sn}$ and the corresponding current steering switches ($Q_{t1}$ and $Q_{f1}$ to $Q_{tn}$ and $Q_{fn}$) for preventing capacitive feedthrough of voltage swings on the current steering switches ($Q_{t1}$ and $Q_{f1}$ to $Q_{tn}$ and $Q_{fn}$) for minimizing crosstalk between the DACs (5). Gates of the cascode devices ($Q_{c1}$ to $Q_{cn}$) of DACs (5) are biased from corresponding cascode bias voltage circuits (25), and the gates of the cascode devices ($Q_{c1}$ to $Q_{cn}$) of each DAC (5) are isolated from the gates of the cascode devices ($Q_{c1}$ to $Q_{cn}$) of the other DACs (5) also for minimizing crosstalk.

18 Claims, 2 Drawing Sheets

MULTI-CHANNEL CIRCUIT WITH CURRENT STEERING DIGITAL TO ANALOGUE CONVERTERS WITH MINIMIZED CROSSTALK

RELATED APPLICATIONS

This application claims priority of U.S. Provisional Application No. 60/328,196, filed on Oct. 10, 2001, and entitled "A MULTI-CHANNEL DAC," incorporated by reference herein.

FIELD OF THE INVENTION

The present invention relates to a multi-channel integrated circuit (IC) in which a digital to analogue converter (DAC) is provided in each channel, and in which crosstalk is minimised. The invention also relates to a method for minimising crosstalk between the DACs in the respective channels.

BACKGROUND OF THE INVENTION

In signal processing ICs for audio, video and data communications, multi-channel processing circuits are required. Each channel is provided with a DAC, and comprises a digital input front end for receiving a digital input signal which is applied to the DAC, and an analogue output end from which an analogue output signal converted from the digital input signal is outputted or further processed. In the processing of audio, video and data signals, and in particular, in the processing of video signals in a multi-channel signal processing circuit, it is essential that the respective channels of the circuit be matched, and in particular, it is important that the analogue end of the DACs of the respective channels should be matched. Mismatch in the analogue ends of the respective DACs can lead to the DACs exhibiting different gain values. Processing effects and minor silicon variations in the die can lead to such mismatch. Various methods and circuitry are provided for minimising mismatch in such DACs, however, in general, such known methods and circuits tend to lead to an increase in crosstalk between the respective DACs. In many applications this is unacceptable.

DACs for use in multi-channel processing circuits for processing audio, video and data communications, in general, are current steering DACs, which comprise a plurality of current sources and associated differential current steering switches. The current steering switches are selectively operable in response to switch bits decoded from a digital word for steering currents from the current sources to either one of a pair of summing nodes for providing an analogue signal corresponding to the digital word. Such current steering DACs may be linear decoded DACs or binary weighted DACs, or may be provided by a combination of both. In a linearly decoded DAC, the DAC current sources are identical to each other, and the differential switches are of identical size. M DAC current sources are provided to convert an N-bit digital word where M is equal to $2^N-1$. In a binary weighted DAC, the DAC current sources are binary weighted, the current source corresponding to the least significant bit (LSB) providing a current of $2^0$ units, while the current source corresponding to the second least significant bit provides a current of $2^1$ units, and the current source corresponding to the third least significant bit provides a current of $2^2$ units, and so on to the most significant bit, which in an N-bit DAC provides a current of $2^{N-1}$ units. The corresponding differential switches are correspondingly binary scaled in size.

The current sources in general are provided by current source devices, typically, MOSFETs coupled to a common supply rail which mirror a reference current provided by a reference circuit. The reference circuit in general comprises a reference current device typically provided by a reference MOSFET coupled to the common supply rail, an amplifier, and a reference resistor. The gates of the current source devices are electrically tied to the gate of the reference FET. The output of the amplifier provides a bias voltage for biasing the gate of the reference current device and the gates of the current source devices. One input of the amplifier is connected to a reference voltage, while the other input is connected to the reference resistor. The reference current device is connected to ground through the reference resistor. The amplifier outputs a voltage which biases the gate of the reference and a reference current is forced through the reference current device and the reference resistor until the voltage across the reference resistor is equal to the reference voltage. The reference current is mirrored in the current source devices. Thus, the value of the reference current, and in turn the gain of the DAC can readily be determined by appropriately selecting the value reference voltage and the resistance value of the reference resistor. In order to facilitate applying a reference voltage to one of the inputs of the amplifier and to facilitate the connection of a reference resistor to the other input of the amplifier and ground, two additional pins are required to the reference circuit.

In order to minimise mismatching, it is known to provide a separate reference circuit for each DAC in a multi-channel signal processing circuit, so that the reference circuits can be located adjacent the corresponding DAC in order to minimise mismatching due to processing effects and silicon variations. However, a disadvantage of providing a separate reference circuit for each DAC is that the die area required for the reference circuits is relatively large in order to accommodate the amplifiers of the respective reference circuits. This is undesirable. Additionally, two extra external pins are required for each reference circuit in order to apply the reference voltages to the amplifiers and in order to connect the respective reference resistors to the amplifiers. Since the trend now is to minimise the number of pins required to an integrated circuit, this is undesirable.

In order to minimise the die area and the number of external pins required by DACs in multi-channel processing circuits, it is known to provide only one reference circuit for all the DACs, and the reference circuit is shared between the DACs. The reference circuit comprises a single amplifier, and the appropriate number of reference current devices are provided connected in parallel between the supply rail and the reference resistor so that one reference current device is provided for each DAC. The respective reference current devices are located as closely as possible to the corresponding DACs. Since only a single amplifier is provided for providing the bias voltage to the reference current devices, the gates of the reference current devices are electrically tied together, thereby causing the gates of the current source devices of all the DACs to be electrically tied together. This results in crosstalk between the respective DACs. The crosstalk results from voltage swings on the current steering switches of one DAC being capacitively fed through to the gates of the current source devices corresponding to the current steering switches of the DAC, thereby modulating the bias voltage on the gates of the current source devices of that DAC. Due to the fact that the gates of the current source devices of the respective DACs are electrically tied together, modulation of the bias voltage on the gates of the current source devices of one DAC appears on the gates of the current source devices of the other DACs, thus causing modulation of the current being steered to the summing nodes of those other DACs, which causes the crosstalk.

In order to minimise the effect of capacitive feedthrough of the voltage swings on the current steering switches to the gates of the corresponding current source devices, it is known to connect an external capacitor between the gates of the current source devices of each DAC and the supply rail, thus minimising crosstalk. However, this requires an external pin to be provided from the gates of the current source devices of each DAC in order to facilitate connection of the respective capacitors during calibration of the respective DACs. This is undesirable, since it increases the pin count of the DACs, and in turn the signal processing circuit, and furthermore does not entirely eliminate crosstalk.

There is therefore a need for a multi-channel circuit comprising DACs in the respective channels of the circuit which overcomes this problem.

The present invention is directed towards providing such a multi-channel circuit, and the invention is also directed towards providing a method for minimising crosstalk between DACs in a multi-channel circuit.

BRIEF SUMMARY OF THE INVENTION

According to the invention there is provided a multi-channel integrated circuit comprising:
a plurality of channels,
a current steering digital to analogue converter (DAC) in each channel,
each DAC comprising a plurality of current sources provided by corresponding current source devices coupled to a common supply rail,
the gates of the current source devices of the DACs being electrically tied together for mirroring a reference current, and being biased by a first bias voltage,
a plurality of current steering switches for steering currents from the current sources to either one of a pair of summing nodes in response to a digital word for providing an analogue output signal on the summing nodes corresponding to the digital word,
a cascode device located between each current source device and the corresponding current steering switch for preventing capacitive feedthrough of voltage swings on the current steering switch to a gate of the corresponding current source device,
a reference circuit for generating the reference current for mirroring by the current source devices of the respective DACs, and for generating the first bias voltage,
a cascode bias voltage circuit being provided for each DAC for providing a second bias voltage for biasing the gates of the cascode devices of the corresponding DAC, the gates of the cascode devices of each DAC being electrically tied to the corresponding cascode bias voltage circuit and being isolated from the gates of the cascode devices of the other DACs for preventing voltage swings on the current steering switches capacitively fed through to the gates of the corresponding cascode devices being transferred to the gates of the cascode devices of the other DACs for minimising crosstalk between the DACs.

Preferably, a reference current circuit is provided for each DAC for generating the reference current for the DAC, each reference current circuit being coupled to the common supply rail, and forming a part of the reference circuit. Advantageously, each reference current circuit comprises a first primary reference current device for generating the reference current for the corresponding DAC, a gate of each first primary reference current device being electrically tied to the gates of the current source devices of the corresponding DAC.

In one embodiment of the invention the reference circuit comprises an amplifier having an output coupled to the gates of the respective first primary reference current devices for providing the first bias voltage thereto, the amplifier having a first input for receiving a reference voltage, and a second input connected to ground through a reference resistor, the respective first primary reference current devices being connected in parallel with each other between the common supply rail and ground through the reference resistor so that respective reference currents are forced through the respective first primary reference current devices as the amplifier maintains the voltage on the second input thereof equal to the reference voltage applied to the first input for establishing the respective reference currents through the first primary reference current devices.

In another embodiment of the invention each reference current circuit comprises a second primary reference current device corresponding to the cascode devices of the corresponding DACs, the second primary reference current device of each reference current circuit being coupled between the first primary reference current device and the reference resistor and in series therewith so that the corresponding reference current flows through the first and second primary reference current devices, a gate of each second primary current device being electrically tied to the gates of the cascode devices of the corresponding DAC.

Preferably, the reference current circuits are similar to each other. Advantageously, each reference current circuit is provided adjacent its corresponding DAC.

In one embodiment of the invention each cascode bias voltage circuit derives the second bias voltage for the gates of the cascode devices of the corresponding DAC from the output voltage of the amplifier of the reference circuit.

In another embodiment of the invention each cascode bias voltage circuit is isolated from the output of the amplifier of the reference circuit by a corresponding secondary current mirror circuit.

In a further embodiment of the invention each secondary current mirror circuit comprises a first secondary reference current device, the gate of which is biased by the output of the amplifier, a second secondary reference current device being connected in series with the first secondary reference current device between the common supply rail and ground, and a third secondary reference current device the gate of which is electrically tied to the second secondary reference current device for mirroring the current through the second secondary reference current device in the third reference current device, the third reference current device being connected in series with a diode connected device between the common supply rail and ground for establishing the second bias voltage between the diode connected device and the third secondary reference current device.

Preferably, the cascode bias voltage circuits are similar to each other. Advantageously, each cascode bias voltage circuit is located adjacent the corresponding DAC.

In one embodiment of the invention the respective current sources of each DAC are binary weighted.

In another embodiment of the invention the current source devices of each DAC are located relatively close to each other.

In a further embodiment of the invention the respective DACs are located relatively close to each other.

Preferably, the reference current circuits are connected to the reference resistor at a common node, and the second input of the amplifier is connected to the common node.

In one embodiment of the invention three external pins are provided to the multi-channel circuit, a first external pin being connected to the first input of the amplifier for applying the reference voltage thereto, a second external pin being provided as a ground pin, and a third external pin being connected to the common node for facilitating connection of the reference resistor between the common node and ground.

The invention also provides a method for minimising crosstalk between current steering DACs of a multi-channel circuit wherein each DAC comprises:

a plurality of current sources provided by corresponding current source devices, the gates of the current source devices being biased by a first bias voltage, a plurality of current steering switches for steering currents from the current sources to either one of a pair of summing nodes in response to a digital word for providing an analogue output signal on the summing nodes corresponding to the digital word, the method comprising the steps of:

coupling a cascode device between each current source device and the corresponding current steering switch for preventing capacitive feedthrough of voltage swings on the current steering switches to a gate of the corresponding current source device, and biasing the gates of the cascode devices of each DAC with respective second bias voltages so that the gates of the cascode devices of each DAC are isolated from the gates of the cascode devices of the other DACs.

ADVANTAGES OF THE INVENTION

The advantages of the invention are many. A particularly important advantage of the invention is that crosstalk between the respective DACs is minimised. This is achieved by virtue of the fact that the cascode devices are provided between the current source devices and the corresponding current steering switches, and in particular, by virtue of the fact that the gates of the cascode devices of each DAC are electrically isolated from the gates of the cascode devices of the other DACs. The cascode devices prevent voltage swings on the current steering switches being capacitively fed through to the gates of the current source devices, and while voltage swings on the current steering switches may be capacitively fed through to the gates of the corresponding cascode devices, since the gates of the cascode devices of each DAC are electrically isolated from the gates of the cascode devices of the other DACs, modulation of the bias voltage on the gates of the cascode devices of one DAC has no effect on the bias voltage on the gates of the cascode devices of the other DACs, thus effectively eliminating crosstalk between the respective DACs. The provision of a separate cascode bias voltage circuit for each DAC permits the gates of the cascode devices to be isolated from each other. Additionally, by virtue of the fact that the cascode devices prevent capacitive feedthrough of current swings on the respective current steering switches to the gates of the current source devices, the bias voltage on the gates of the current source devices of each DAC is constant since the output voltage of the amplifier of the reference circuit remains constant. Modulation of the voltage on the gate of one cascode device due to a voltage swing on the corresponding current steering switch has less effect on the currents flowing through the other cascode devices of the corresponding DAC than would be caused by modulation on the gate of one of the current source devices, since the voltage tolerance permitted on the gates of the cascode device is considerably broader than the voltage tolerance which is permitted on the current source devices, since it is the current source devices which set the respective currents for the DACs.

Additionally, by virtue of the fact that the respective DACs share the reference circuit, and in particular, by virtue of the fact that the reference circuit comprises a plurality of reference current circuits, one reference current circuit being provided for each DAC, the reference current circuits of the respective DACs may be located adjacent the DACs, and thus mismatching, and in particular, gain mismatching between the respective DACs is minimised while at the same time avoiding crosstalk.

A further advantage of the invention is that crosstalk is minimised and effectively eliminated without the need for an external capacitor connected between the gates of the current source devices of each DAC and the voltage supply rail.

Another advantage of the invention is that the insertion of the cascode devices between the current source devices and the corresponding current steering switches of the respective DACs increases the effective impedance of the current sources, and thus increases the output impedance of the respective DACs.

The invention will be more clearly understood from the following description of a preferred embodiment thereof, which is given by way of example only, with reference to the accompanying drawings.

DISCLOSURE OF THE PREFERRED EMBODIMENT

Figure 1:
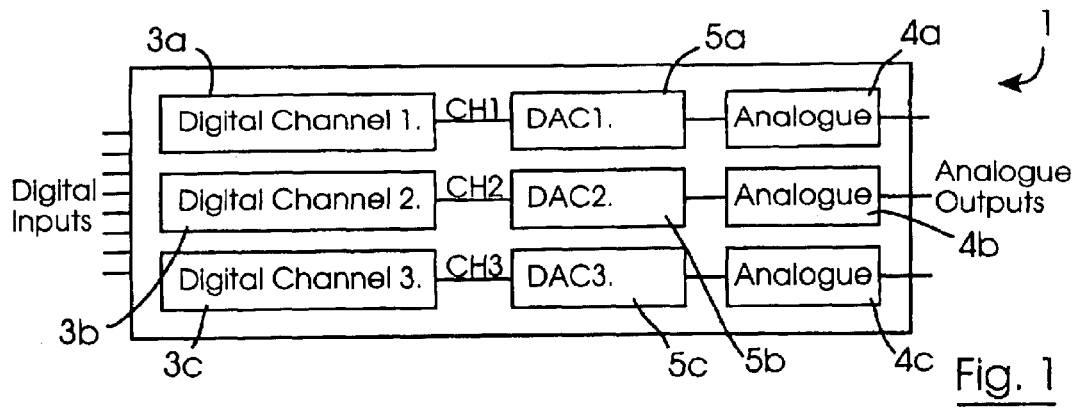
FIG. 1 is a block representation of a multi-channel circuit according to the invention.

Referring to the drawings, there is illustrated a multi-channel circuit according to the invention, which in this embodiment of the invention is a multi-channel signal processing integrated circuit, indicated generally by the reference numeral 1. The multi-channel circuit 1 comprises three independent channels, namely, a first channel CH1, a second channel CH2, and a third channel CH3. Each channel comprises a digital front input end 3, and an analogue rear output end 4. A DAC 5 is provided in each channel CH1 to CH3 for converting digital input signals from the digital input end 3 to analogue signals which are outputted to the analogue output end 4 and further processed therein. Any desired signal processing may be carried out in the analogue output ends 3 of the channels CH1 to CH3, and such signal processing will be well known to those skilled in the art. For convenience the digital input end 3 of the first input channel CH1 is identified by the reference numeral 3a, while the digital input end 3 of the second channel CH2 is identified by the reference numeral 3b, and the digital input end 3 of the third channel CH3 is identified by the reference numeral 3c. Similarly, the analogue output ends 4 of the first, second and third channels CH1, CH2 and CH3 are identified by the reference numerals 4a, 4b and 4c, respectively. The DACs 5 of the first, second and third channels CH1, CH2 and CH3 are similarly identified by the reference numerals 5a, 5b and 5c. Digital input signals are applied to the digital input ends 3 of the respective channels CH1, CH2 and CH3, and processed analogue signals are outputted from the analogue output ends 4. The multi-channel signal processing circuit 1 is particularly suitable for processing audio, video and data communication signals, the processing of which will be well known to those skilled in the art.

Figure 3:
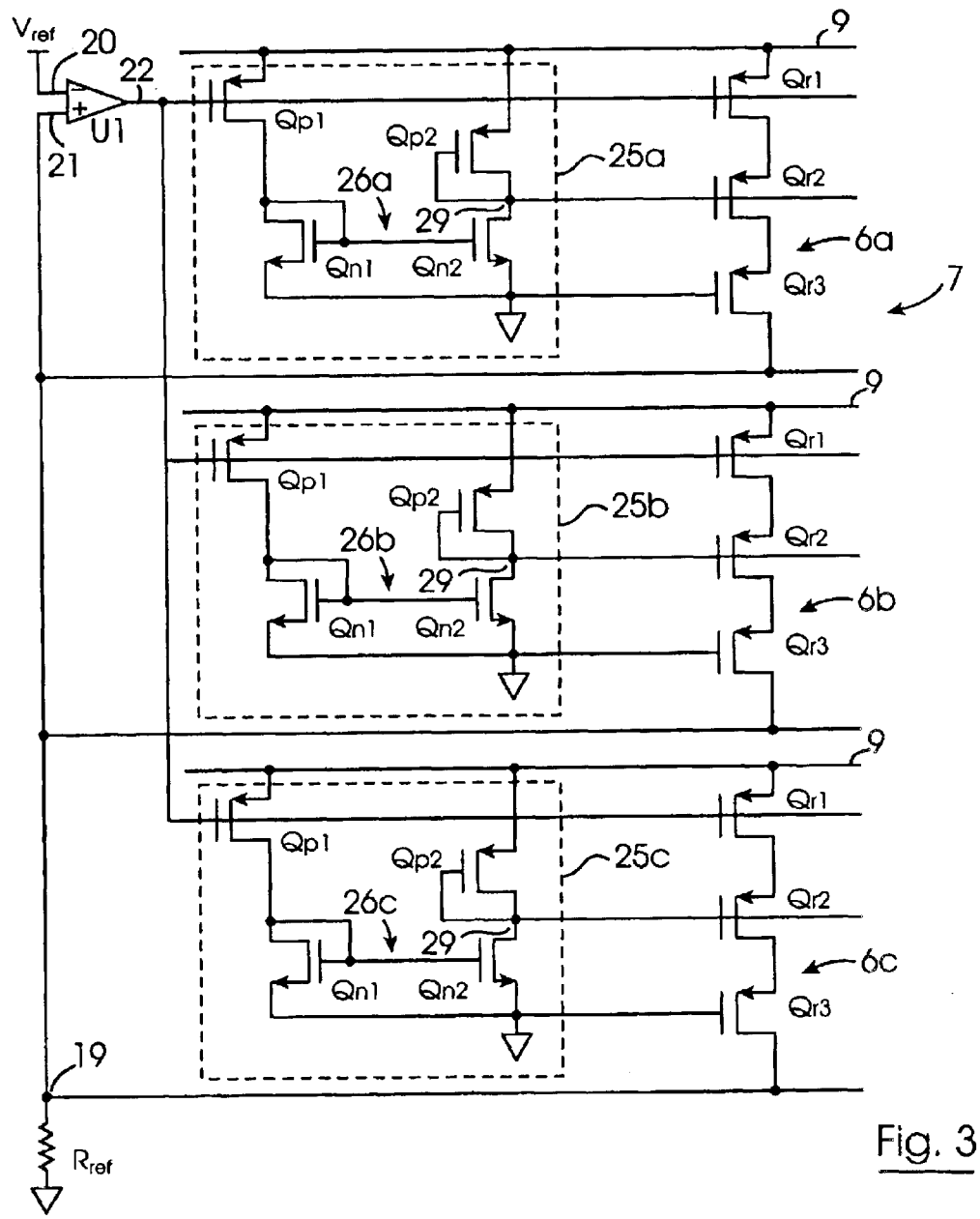
FIG. 3 is a circuit diagram of a portion of the circuit of FIG. 2.
Figure 2:
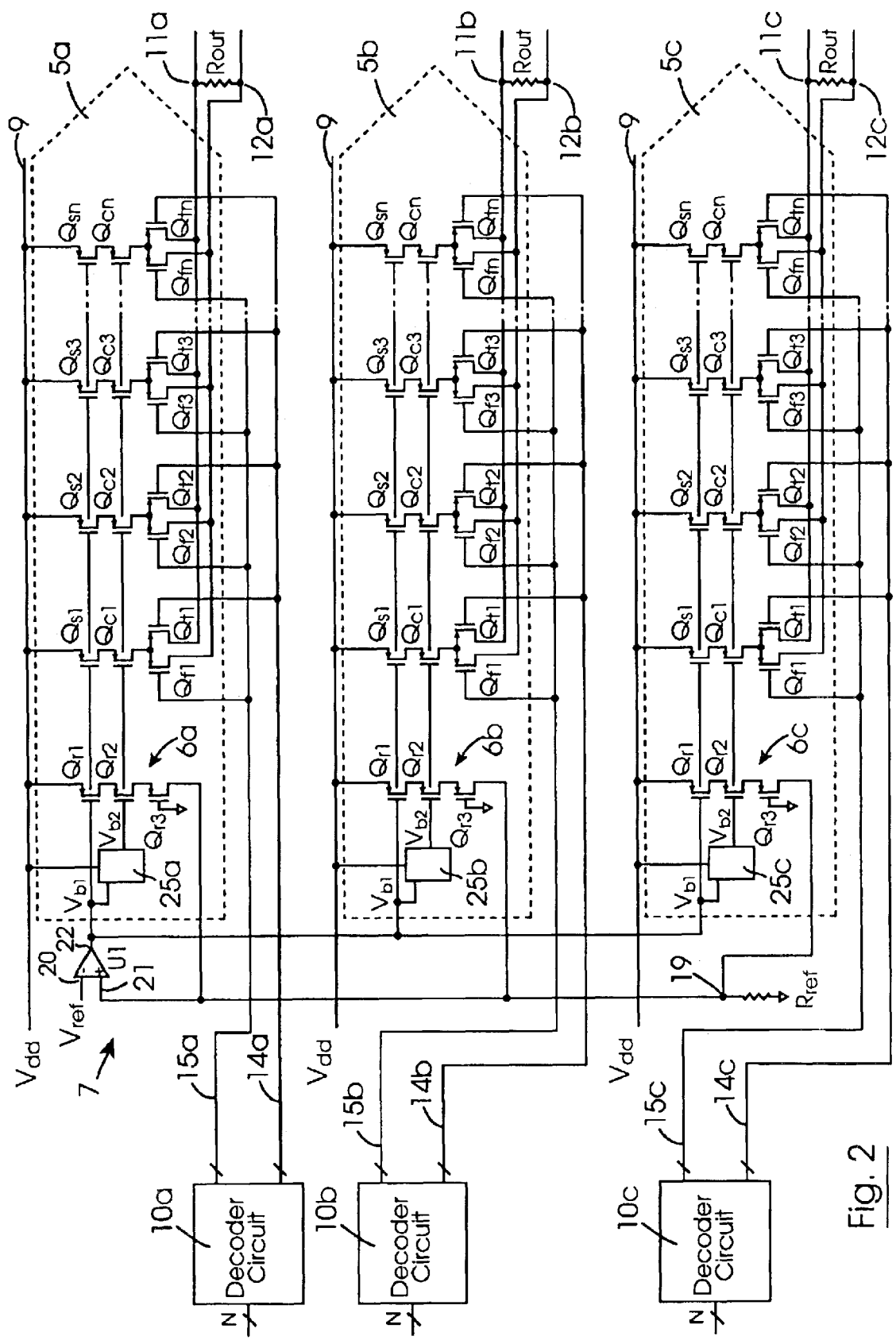
FIG. 2 is a circuit diagram of a part of the multi-channel circuit of FIG. 1.

Referring now to FIGS. 2 and 3, the DACs 5 of the three channels CH1, CH2 and CH3 will now be described in detail. The DACs 5 are identical to each other, and since the three DACs 5a, 5b and 5c are identical to each other, only the DAC 5a will be described. Components which are identified by reference numerals with the designation "a" for the DAC 5a are identified by the same reference numerals with the designations "b" and "c" for the corresponding DACs 5b and 5c. Each DAC 5 is an N-bit binary weighted current steering DAC comprising N current sources. The current sources are provided by current source devices implemented by PMOS FETs $Q_{s1}$ to $Q_{sn}$, which mirror a reference current from a corresponding reference current circuit 6 of a reference circuit 7 as will be described below. The current source devices $Q_{s1}$ to $Q_{sn}$ are binary scaled for providing binary weighted currents. The current source device $Q_{s1}$ corresponds to the least significant bit (LSB) and is of unit area $2^0$ for providing a unit current of $2^0$. The current source device $Q_{s2}$ corresponds to the second least significant bit and is of area $2^1$ units for outputting a current of $2^1$ units, and so on up to the current source device $Q_{sn}$ which corresponds to the most significant bit and is of area $2^{N-1}$ units for providing a current of $2^{N-1}$ units. The current source devices $Q_{s1}$ to $Q_{sn}$ of the respective DACs 5a, 5b and 5c are supplied from a common supply rail 9 which is held at the supply voltage $V_{dd}$.

Current steering switches comprising differential switch pairs provided by MOSFETs $Q_{t1}$ and $Q_{f1}$ to $Q_{tn}$ to $Q_{fn}$ steer the currents from the current source devices $Q_{s1}$ to $Q_{sn}$ of each DAC 5 in response to switch bits decoded from a digital word by a corresponding decoder 10 to either of a pair of summing nodes 11 and 12 for developing an analogue voltage corresponding to the digital word across an output resistor $R_{out}$ connected between the respective summing nodes 11 and 12. A bus 14 from the decoder 10 applies true switch bits of the digital word to the corresponding switches $Q_{t1}$ to $Q_{tn}$ while a bus 15 from the decoder 10 applies false switch bits of the digital word to the corresponding switches $Q_{f1}$ to $Q_{fn}$. Each current source device $Q_{s1}$ to $Q_{sn}$ is coupled to its corresponding differential switch pairs $Q_{t1}$ and $Q_{f1}$ to $Q_{tn}$ and $Q_{sn}$ through a corresponding cascode device $Q_{c1}$ to $Q_{cn}$ which are provided by binary scaled MOSFETs $Q_{c1}$ to $Q_{cn}$ for preventing capacitive feedthrough of voltage swings on the differential switch pairs $Q_{t1}$ and $Q_{f1}$ to $Q_{tn}$ and $Q_{fn}$ to the gates of the corresponding current source devices $Q_{s1}$ to $Q_{sn}$.

Turning now to the reference circuit 7, and referring in particular to FIGS. 2 and 3, the reference circuit 7 comprises a single high gain amplifier U1 which is shared by the reference current circuits 6 of the respective DACs 5a, 5b and 5c. The reference current circuits 6 are similar to each other, and each reference current circuit 6 comprises a first primary reference current device $Q_{r1}$, a second primary reference current device $Q_{r2}$, and a third primary reference current device $Q_{r3}$, provided by respective MOSFETs. The reference current circuits 6 of the respective DACs 5 are connected in parallel between the common supply rail 9 and a common node 19. The common node 19 is connected to ground through a reference resistor $R_{ref}$. The gate of the first primary reference current device $Q_{r1}$ of each DAC 5 is electrically tied to the gates of the current source devices $Q_{s1}$ to $Q_{sn}$ of the corresponding DAC 5 for forming the current mirror circuits for mirroring the reference current in the respective current source devices $Q_{s1}$ to $Q_{sn}$. A first bias voltage $V_{b1}$ provided on the output 22 of the amplifier U1 biases the gates of the first primary reference current devices $Q_{r1}$, and in turn the gates of the current source devices $Q_{s1}$ to $Q_{sn}$ for operating the current source devices $Q_{s1}$ to $Q_{sn}$ in their saturation modes.

A first input of the amplifier U1, namely, the inverting input 20 is connected to a reference voltage $V_{ref}$. A second input of the amplifier U1, namely, the non-inverting input 21 is connected to the common node 19. Accordingly, the amplifier U1 in order to maintain the voltage on the non-inverting input 21 equal to the reference voltage $V_{ref}$ on the inverting input 20 outputs the first bias voltage such that currents are forced through the first, second and third primary reference current devices $Q_{r1}$, $Q_{r2}$ and $Q_{r3}$ of each of the reference current circuits 6 to develop a voltage across the reference resistor $R_{ref}$ which is equal to the reference voltage $V_{ref}$. The currents through the first reference current devices are similar and are the reference currents for each DAC 5.

The gate of the second primary reference current device $Q_{r2}$ of each DAC 5 is electrically tied to the gates of the cascode devices $Q_{c1}$ to $Q_{cn}$ of the corresponding DAC 5 to form respective current mirror circuits with the cascode devices $Q_{c1}$ to $Q_{cn}$. Three cascode bias voltage circuits 25, which are similar to each other, are provided in the reference circuit 7, one cascode bias voltage circuit 25 being provided for each DAC 5. The respective cascode bias voltage circuits 25 provide a second bias voltage $V_{b2}$ for biasing the gate of the second primary reference current device $Q_{r2}$, and in turn, the gates of the cascode devices $Q_{c1}$ to $Q_{cn}$ of the corresponding DAC 5, for operating the cascode devices $Q_{c1}$ to $Q_{cn}$ in their saturation modes. The third primary reference current device $Q_{r3}$ of each reference current circuit 6 is provided for balancing the voltage drop across the reference current source circuit 6 with the voltage drop across the current source devices $Q_{s1}$ to $Q_{sn}$ and the cascode devices $Q_{c1}$ to $Q_{cn}$ of each current source of the corresponding DAC 5. The gate of each third reference current device $Q_{r3}$ is connected to ground.

Each cascode bias voltage circuit 25 comprises a secondary current mirror circuit 26 for deriving the second bias voltage $V_{b2}$ from the first bias voltage $V_{b1}$ from the output of the amplifier U1. A first secondary current source device provided by a PMOS FET $Q_{p1}$ is coupled to the common supply rail 9 and to ground through a second secondary current source device provided by an NMOS FET $Q_{n1}$ which forms a current source of the secondary current mirror circuit 26. The gate of the first secondary current source device $Q_{p1}$ is biased by the first bias voltage $V_{b1}$ outputted by the amplifier U1 for providing a constant current through the first secondary current source device $Q_{p1}$ and the second secondary current source device $Q_{n1}$. A third secondary current source device provided by an NMOS FET $Q_{n2}$ the gate of which is electrically tied to the gate of the second secondary current source device $Q_{n1}$ mirrors the current in the second secondary current source device $Q_{n1}$. The third secondary current source device $Q_{n2}$ is connected to ground and to the common supply rail 9 through a diode connected PMOS FET $Q_{p2}$ so that the current mirrored through the third secondary current source device $Q_{n2}$ establishes the second bias voltage $V_{b2}$ at a node 29 between the third secondary current source device $Q_{n2}$ and the diode connected PMOS device $Q_{p2}$.

The node 29 is isolated from the output of the amplifier U1 by the secondary current mirror circuit 26, and in turn from the gates of the current sources devices $Q_{s1}$ to $Q_{sn}$ of the respective DACs 5. Accordingly, the gates of the cascode devices $Q_{c1}$ to $Q_{cn}$ of each DAC are isolated from the gates of the cascode devices $Q_{c1}$ to $Q_{cn}$ of the other DACs 5. The cascode devices $Q_{c1}$ to $Q_{cn}$ of each DAC 5 prevent capacitive feedthrough of voltage swings on the current steering switches $Q_{t1}$ and $Q_{f1}$ to $Q_{tn}$ and $Q_{fn}$ to the gates of the current source devices $Q_{s1}$ to $Q_{sn}$ of the corresponding DAC 5, thereby avoiding modulation of the first bias voltage on the gates of the current source devices $Q_{s1}$ to $Q_{sn}$. Thus, crosstalk between the respective DACs 5 resulting from voltage swings on the current steering switches $Q_{t1}$ and $Q_{f1}$ to $Q_{tn}$ and $Q_{fn}$ via the gates of the current source devices $Q_{s1}$ to $Q_{sn}$ is eliminated. Additionally, by virtue of the fact that a separate cascode bias voltage circuit 25 is provided for each DAC 5, and by virtue of the fact that the node 29 on which the second bias voltage $V_{b2}$ is developed in each cascode bias voltage circuit 25 is isolated from the output of the amplifier U1, and in turn from the gates of the current source devices $Q_{s1}$ to $Q_{sn}$ of the other DACs, there is no danger of a voltage modulation on the gates of the cascode devices $Q_{c1}$ to $Q_{cn}$ of one DAC being transferred to the gates of the current source devices $Q_{s1}$ to $Q_{sn}$ of the other DACs, or to the gates of the cascode devices $Q_{c1}$ to $Q_{cn}$ of the other DACs 5. Thus, while current swings on the current steering switches $Q_{t1}$ and $Q_{f1}$ to $Q_{tn}$ and $Q_{fn}$ may be capacitively fed through to the gates of the corresponding cascode devices $Q_{c1}$ to $Q_{cn}$ there is no danger of modulation on the gates of the cascode devices $Q_{c1}$ to $Q_{cn}$ of one DAC being transferred to the gates of the cascode devices $Q_{c1}$ to $Q_{cn}$ or the current source devices $Q_{s1}$ to $Q_{sn}$ of the other DACs 5. Accordingly, crosstalk between the respective DACs 5a, 5b and 5c is eliminated.

Additionally, since the setting of the currents from the current sources of the respective DACs is set by the current source devices $Q_{s1}$ to $Q_{sn}$, the cascode devices $Q_{c1}$ to $Q_{cn}$ have little effect on the current from the current source devices $Q_{s1}$ to $Q_{sn}$, and thus, small variations in the second bias voltage $V_{b2}$ can be tolerated without affecting the currents from the current source devices $Q_{s1}$ to $Q_{sn}$.

In fabricating the multi-channel circuit 1, the DACs 5 of the respective three channels CH1 to CH3 are fabricated relatively close to each other to minimise mismatch due to processing effects and silicon variation. The reference current circuits 6 corresponding to the respective DACs 5 are located adjacent their corresponding DACs 5. Additionally, the cascode bias voltage circuits 25 are also located in the die adjacent their corresponding DACs 5. By virtue of the fact that the DACs 5 are located as closely as possible, the amplifier U1 of the reference circuit 7 can thus be located relatively closely to the three DACs 5. An external pin (not shown) is provided to the common supply rail 9 for applying the supply voltage thereto. An external ground pin (not shown) is also provided. External pins (not shown) are also provided to the inverting input 20 of the amplifier U1 and to the common node 19 for facilitating applying the reference voltage $V_{ref}$ to the reference circuit 7, and for connecting the reference resistor $R_{ref}$ to the reference circuit 7, respectively. Other external pins as appropriate are provided, as will be understood by those skilled in the art.

In use, the appropriate value of the reference voltage $V_{ref}$ and the reference resistor $R_{ref}$ of the appropriate value are selected for setting the gain of the DACs 5. The reference voltage $V_{ref}$ is applied to the inverting input 20 of the amplifier U1 through the appropriate external pin (not shown), and the reference resistor $R_{ref}$ is connected across the common node 19 and ground through appropriate external pins (not shown). The multi-channel circuit 1 is then ready for use, and as the digital signals are applied to the respective channels CH1 to CH3, the digital words of the digital signals are decoded in the corresponding decoders 10a to 10c. The decoders 10 output true and false switch bits on the corresponding buses 14 and 15 for selecting the appropriate ones of the differential switch pairs $Q_{t1}$ and $Q_{f1}$ to $Q_{tn}$ and $Q_{fn}$ of the current steering switches for appropriately steering the currents from the current source devices $Q_{s1}$ to $Q_{sn}$ to the summing nodes 11 and 12 for providing respective corresponding analogue signals corresponding to the digital words on the resistors $R_{out}$ of the corresponding DACs 5a to 5c.

While each DAC has been described as being provided with a corresponding reference current source circuit, it is envisaged that in certain cases a single reference current source circuit may be provided for the respective DACs.

While the DACs have been described as being binary weighted DACs, the DACs may be provided as linearly decoded DACs, or as a combination of binary and linearly decoded DACs.

While the multi-channel circuit has been described as comprising three channels, it will be readily apparent to those skilled in the art that the multi-channel circuit may be provided with any number of channels, each of which would comprise a separate DAC, and the respective DACs would share the same reference circuit.

While the multi-channel circuit has been described as being a multi-channel signal processing circuit, the multi-channel circuit may be any type of multi-channel circuit which comprises DACs in the channels of the circuit.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A multi-channel integrated circuit comprising:
   a plurality of channels,
   a current steering digital to analogue converter (DAC) in each channel, each DAC comprising:
   a plurality of current sources provided by corresponding current source devices coupled to a common supply rail,
   the gates of the current source devices of the DACs being electrically tied together for mirroring a reference current, and being biased by a first bias voltage,
   a plurality of current steering switches for steering currents from the current sources to either one of a pair of summing nodes of the corresponding DAC in response to a digital word for providing an analogue output signal on the summing nodes corresponding to the digital word,
   a cascode device located between each current source device and the corresponding current steering switch for preventing capacitive feedthrough of voltage swings on the current steering switch to the gate of the corresponding current source device, a reference circuit for generating the reference current for mirroring by the current source devices of the respective DACs, and for generating the first bias voltage, a separate cascode bias voltage circuit being provided for each DAC for providing a second bias voltage for biasing the gates of the cascode devices of the corresponding DAC, the gates of the cascode devices of each DAC being electrically tied to the corresponding cascode bias voltage circuit for applying the second bias voltage to the cascode devices of the corresponding DAC, and being isolated from the gates of the cascode devices of the other DACs for preventing voltage swings on the current steering switches capacitively fed through to the gates of the corresponding cascode devices being transferred to the gates of the cascode devices of the other DACs for minimising crosstalk between the DACs.

2. A multi-channel circuit as claimed in claim 1 in which a reference current circuit is provided for each DAC for generating the reference current for the DAC, each reference current circuit being coupled to the common supply rail, and forming a part of the reference circuit.

3. A multi-channel circuit as claimed in claim 2 in which each reference current circuit comprises a first primary reference current device for generating the reference current for the corresponding DAC, a gate of each first primary reference current device being electrically tied to the gates of the current source devices of the corresponding DAC.

4. A multi-channel circuit as claimed in claim 3 in which the reference circuit comprises an amplifier having an output coupled to the gates of the respective first primary reference current devices for providing the first bias voltage thereto, the amplifier having a first input for receiving a reference voltage, and a second input connected to ground through a reference resistor, the respective first primary reference current devices being connected in parallel with each other between the common supply rail and ground through the reference resistor so that respective reference currents are forced through the respective first primary reference current devices as the amplifier maintains the voltage on the second input thereof equal to the reference voltage applied to the first input for establishing the respective reference currents through the first primary reference current devices.

5. A multi-channel circuit as claimed in claim 4 in which each cascode bias voltage circuit derives the second bias voltage for the gates of the cascode devices of the corresponding DAC from the output voltage of the amplifier of the reference circuit.

6. A multi-channel circuit as claimed in claim 5 in which each cascode bias voltage circuit is isolated from the output of the amplifier of the reference circuit by a corresponding secondary current mirror circuit.

7. A multi-channel circuit as claimed in claim 6 in which each secondary current mirror circuit comprises a first secondary reference current device, the gate of which is biased by the output of the amplifier, a second secondary reference current device being connected in series with the first secondary reference current device between the common supply rail and ground, and a third secondary reference current device the gate of which is electrically tied to the second secondary reference current device for mirroring the current through the second secondary reference current device in the third reference current device, the third reference current device being connected in series with a diode connected device between the common supply rail and ground for establishing the second bias voltage between the diode connected device and the third secondary reference current device.

8. A multi-channel circuit as claimed in claim 4 in which the reference current circuits are connected to the reference resistor at a common node, and the second input of the amplifier is connected to the common node.

9. A multi-channel circuit as claimed in claim 8 in which three external pins are provided to the multi-channel circuit, a first external pin being connected to the first input of the amplifier for applying the reference voltage thereto, a second external pin being provided as a ground pin, and a third external pin being connected to the common node for facilitating connection of the reference resistor between the common node and ground.

10. A multi-channel circuit as claimed in claim 4 in which each reference current circuit comprises a second primary reference current device corresponding to the cascode devices of the corresponding DACs, the second primary reference current device of each reference current circuit being coupled between the first primary reference current device and the reference resistor and in series therewith so that the corresponding reference current flows through the first and second primary reference current devices, a gate of each second primary current device being electrically tied to the gates of the cascade devices of the corresponding DAC.

11. A multi-channel circuit as claimed in claim 2 in which the reference current circuits are similar to each other.

12. A multi-channel circuit as claimed in claim 2 in which each reference current circuit is provided adjacent its corresponding DAC.

13. A multi-channel circuit as claimed in claim 1 in which the cascode bias voltage circuits are similar to each other.

14. A multi-channel circuit as claimed in claim 1 in which each cascode bias voltage circuit is located adjacent the corresponding DAC.

15. A multi-channel circuit as claimed in claim 1 in which the respective current sources of each DAC are binary weighted.

16. A multi-channel circuit as claimed in claim 1 in which the current source devices of each DAC are located relatively close to each other.

17. A multi-channel circuit as claimed in claim 1 in which the respective DACs are located relatively close to each other.

18. A method for minimising crosstalk between current steering DACs of a multi-channel circuit wherein each channel comprises one of the DACs, and each DAC comprises:

a plurality of current sources provided by corresponding current source devices, the gates of the current source devices being biased by a first bias voltage, a plurality of current steering switches for steering currents from the current sources to either one of a pair of summing nodes of the corresponding DAC in response to a digital word for providing an analogue output signal on the summing nodes corresponding to the digital word, and wherein a reference circuit is provided for generating the reference current for mirroring by the current source devices of the respective DACs, and for generating the first bias voltage, the method comprising the steps of:

coupling a cascade device between each current source device and the corresponding current steering switch for preventing capacitive feedthrough of voltage swings on the current steering switches to the gate of the corresponding current source device, providing a separate cascode bias voltage circuit for each DAC for providing a second bias voltage for biasing the gates of the cascode devices of the corresponding DAC, and coupling the gates of the cascode devices of each DAC to the corresponding cascode bias voltage circuit for applying the second bias voltage to the cascode devices of the corresponding DAC so that the gates of the cascode devices of each DAC are isolated from the gates of the cascode devices of the other DACs.

* * * * *